(12) United States Patent
Hefyene et al.

(10) Patent No.: US 11,298,968 B2
(45) Date of Patent: Apr. 12, 2022

(54) METHOD FOR LABELING PRODUCTS WITH A TRANSPARENT PHOTOLUMINESCENT LABEL, AND TRANSPARENT PHOTOLUMINESCENT LABEL

(71) Applicant: ECOLE POLYTECHNIQUE FEDERALE DE LAUSANNE (EPFL), Lausanne (CH)

(72) Inventors: Nasser Hefyene, Lausanne (CH); Nicolas Grandjean, Préverenges (CH)

(73) Assignee: Ecole Polytechnique Federale de Lausanne, Lausanne (CH)

( * ) Notice: Subject to any disclaimer, the term of this patent is extended or adjusted under 35 U.S.C. 154(b) by 55 days.

(21) Appl. No.: 16/988,238

(22) Filed: Aug. 7, 2020

(65) Prior Publication Data

US 2020/0369069 A1    Nov. 26, 2020

Related U.S. Application Data

(62) Division of application No. 15/758,128, filed as application No. PCT/IB2015/059037 on Nov. 23, 2015, now Pat. No. 10,752,043.

(51) Int. Cl.
*B42D 25/387* (2014.01)
*C23C 16/04* (2006.01)
(Continued)

(52) U.S. Cl.
CPC .......... *B42D 25/387* (2014.10); *B42D 25/36* (2014.10); *B42D 25/373* (2014.10);
(Continued)

(58) Field of Classification Search
CPC ..... B42D 25/387; B42D 25/36; B42D 25/373
See application file for complete search history.

(56) References Cited

U.S. PATENT DOCUMENTS 6,445,009 B1    9/2002  Grandjean et al.
6,730,943 B2    5/2004  Massies et al.
(Continued)

FOREIGN PATENT DOCUMENTS

CH      706621      12/2013
EP    1273049 A1     1/2003
(Continued)

OTHER PUBLICATIONS

International Search Report and Written Opinion for PCT/IB2015/059037 dated Nov. 23, 2015, 12 pages.
(Continued)

*Primary Examiner* — Nathan T Leong
(74) *Attorney, Agent, or Firm* — Blank Rome LLP

(57) ABSTRACT

A method for marking a product (1) with a photoluminescent mark, said mark comprising a photoluminescent portion (10) which is transparent under normal light conditions and revealed by photoluminescence under UV illumination, said mark further comprising a non photoluminescent portion (9) which is transparent under normal light conditions as well s under UV illumination, said method comprising: depositing on said product a stack, said stack comprising alternatively layers (2,4) such as AlN, with a thickness of less than 1 micron and layers (3) of a second material, such as GaN with a thickness of less than 10 nm; raising the transparency of (Continued)

said non photoluminescent portion (10) with a deposition of transparent material (6) or incorporation of ions into said non photoluminescent portions.

20 Claims, 3 Drawing Sheets

(51) Int. Cl.
    *C23C 16/30*     (2006.01)
    *G04B 45/00*     (2006.01)
    *B42D 25/43*     (2014.01)
    *C09K 11/08*     (2006.01)
    *B42D 25/36*     (2014.01)
    *C09K 11/64*     (2006.01)
    *C09K 11/62*     (2006.01)
    *B42D 25/373*     (2014.01)
    *B42D 25/415*     (2014.01)
    *B42D 25/465*     (2014.01)
    *C23C 14/04*     (2006.01)
    *C23C 14/06*     (2006.01)

(52) U.S. Cl.
    CPC ............ *B42D 25/415* (2014.10); *B42D 25/43* (2014.10); *B42D 25/465* (2014.10); *C09K 11/0883* (2013.01); *C09K 11/62* (2013.01); *C09K 11/64* (2013.01); *C23C 14/042* (2013.01); *C23C 14/0617* (2013.01); *C23C 16/042* (2013.01); *C23C 16/303* (2013.01); *G04B 45/0015* (2013.01); *G04B 45/0084* (2013.01)

(56) References Cited

U.S. PATENT DOCUMENTS

| | | | |
|---|---|---|---|
| 8,964,513 | B2 | 2/2015 | Derriey et al. |
| 2001/0033371 | A1 | 10/2001 | Lawandy |
| 2005/0042370 | A1 | 2/2005 | McManus |
| 2009/0289270 | A1* | 11/2009 | Hanawa ................. C30B 25/183 257/98 |
| 2010/0062194 | A1* | 3/2010 | Sun ...................... B42D 25/387 428/29 |
| 2012/0068450 | A1 | 3/2012 | Macpherson et al. |

FOREIGN PATENT DOCUMENTS

| | | |
|---|---|---|
| EP | 1297491 A1 | 4/2003 |
| EP | 1893542 A1 | 3/2008 |
| EP | 2006796 A2 | 12/2008 |
| FR | 2587504 A1 | 3/1987 |
| JP | 62-19789 A | 1/1987 |
| JP | 2015158604 A | 9/2015 |
| WO | WO-02/03323 A1 | 1/2002 |

OTHER PUBLICATIONS

W. Li, et al., "Enhancement of Electroluminescence from Embedded Si Quantum Dots/SiO$_2$ Multilayers Film by Localized-Surface-Plasmon and Surface Roughening", Scientific Reports, www.nature.com/scientificreports; Jul. 3, 2015, pp. 1-7.

Q. Zhang, et al., "Enhancing Extraction Efficiency of Quantum Dot Light-Emitting Diodes by Surface Engineering", Optics Express, vol. 25, No. 15, Jul. 24, 2017, pp. 17683-17694.

* cited by examiner

METHOD FOR LABELING PRODUCTS WITH A TRANSPARENT PHOTOLUMINESCENT LABEL, AND TRANSPARENT PHOTOLUMINESCENT LABEL

RELATED APPLICATIONS

This application is a divisional application of U.S. National Phase application Ser. No. 15/758,281, filed on Mar. 7, 2018, now U.S. Pat. No. 10,752,043, which is a national phase of PCT/IB2015/059037, filed on Nov. 23, 2015. The entire contents of this application is hereby incorporated by reference.

FIELD OF THE INVENTION

The present invention concerns the labeling of products with transparent, and thus, invisible photoluminescent labels.

DESCRIPTION OF RELATED ART

Covert marking solutions are widely used for protecting products to be protected against counterfeiting by marking them with a hidden mark which is difficult or expensive to reproduce for counterfeiter. A user can then verify the authenticity of the product by verifying the presence and authenticity of the covert mark.

As an example, CH20120000775 suggest to protect watch parts with a mark which is invisible under normal lighting conditions, and visible when illuminated with a UV laser. The technology is based on interferences and requires a UV laser with a specific wavelength to be revealed. It is adapted to the marking of parts made of a reflective material produced with the Liga process.

FR2587504 discloses a watch having a hologram associated with or replacing the watch glass. This hologram is positioned so that, depending on the angle of incidence chosen with respect to a light source, either the conventional function of a watch appears or a three-dimensional image with the impression of relief appears, due to the hologram.

EP2006796 suggests another protection against counterfeiting of luxury goods such as watches. It is based on a hologram created with a thin film.

EP2009104409 (EP1893542) discloses another hologram in a sapphire substrate, in the field of watch making. The aim is decorative.

JP62019789 discloses a transmission type hologram layer is formed on a watch cover.

EP1297491 discloses a CLR technology for transparent substrates.

Some documents also suggest to protect products with a pattern of light emitting material. As an example, embodiments of US2010062194A relate to light emitting material having an anti-counterfeit pattern. The light emitting material is configured to emit visible light in response to absorption of ultraviolet light. The light emitting material includes light emitting particles having a diameter less than about 500 nanometers. Accordingly, the anti-counterfeit pattern may be invisible under ambient light. However, under ultraviolet light, the authenticity of a product may be identified by emission of light in the form of the anti-counterfeit pattern.

US2001033371A discloses a method for coding information about an object with quantum dots, semiconductor nanocrystals and semiconductor particles used as fluorescent coding elements.

U.S. Pat No. 6,445,009B, whose content is included by reference, discloses a device includes a silicon substrate provided with a coating and including at least one stacking constituted by a plane of GaN or GaInN quantum dots emitting visible light at room temperature in a respective layer of AlN or GaN. This device is used for white light production.

A similar technology is also disclosed in EP1273049B1, whose content is included by reference.

Counterfeiters invest significant amount for developing the technology which is required for reproducing covert marks. Many protection technologies remain effective only during a limited period, i.e., until counterfeiters manage to hack the protection.

It is therefore an aim of the present invention to propose a new product labeling method which is different from existing methods.

Another aim is to propose a product labeling method which is more difficult to reproduce than most existing methods.

Another aim is to propose a labeling method whose presence and authenticity is easy to verify without expensive or rare equipment.

Another aim is to propose a product labelling method adapted for transparent material including glass or sapphire.

Another aim is to propose a product labeling method which is invisible or almost invisible under normal lighting conditions and visible under special lighting conditions.

Another aim is to propose a product labeling method comprising photoluminescent portions and non photoluminescent portions, and in which the interface between those two portions is less visible under normal lightning conditions.

BRIEF SUMMARY OF THE INVENTION

According to the invention, these aims are achieved by means of a method for labeling a product with a photoluminescent label, said label comprising a photoluminescent portion which is transparent under normal light conditions and revealed by photoluminescence under UV illumination, said label further comprising a non photoluminescent portion which is transparent under normal light conditions as well as under UV illumination, said method comprising:
  deposing on said product a stack, said stack comprising alternate nanolayers of two different materials, such as AlN, with a thickness less than 1 micron and second material, such as GaN, with a thinkness of less than 10 nm.
  raising the transparency of said non photoluminescent portion with a deposition of transparent material or incorporation of ions into said non photoluminescent portions.

This method has the advantage of an increased transparency of the label, in particular of the non photoluminescent portions of the label and of the interface between photoluminescent and non photoluminescent portions.

The label could be used for tracing the product.

The label could be used as a hard to replicate protection against counterfeiting. The invisibility results in an increased security, since a counterfeiter does not even see that a product is marked unless he verifies with a UV light.

The layers are deposited by known growth methods with an accuracy of the nanometer range, such as sputtering, Atomic Layer deposition, Molecular Beam Epitaxy and Metal Organic Chemical Vapor Deposition techniques.

In one embodiment, the non-luminescent transparency is increased by incorporating ions into the stack which deactivate locally the photoluminescence ability of the stack.

The ions may include Oxygen, Nitrogen, Hydrogen, Helium, Neon, Argon, Magnesion, Lithium, Beryllium, Bore, Phosphor, Aluminum, Zinc, Arsenic, Galium, Silicon, Cadmium and/or any kind of element capable of degrading the photoluminescent stack and creating non-radiative recombination center defects into the stack.

The ions may be incorporated within the stack by several methods, such as diffusion or implantation.

The ions may be incorporated within the stack through a mask so as to create a pattern of different sizes and forms, such as alpha-numerical contents, figures, draws, images, etc.

The layers may be deposited through a mask so as to create a pattern of different sizes and forms, such as alpha-numerical texts, figures, draws, etc.

In one embodiment, the method comprises a selective engraving of portions of the stack so as to create non photoluminescent portions.

A transparent material may be deposited onto said non photoluminescent portions.

The transparent material deposited onto the non photoluminescent portions has a refractive index which is preferably close to the refractive index of the stack. This reduces the refraction at the interface between the photoluminescent and non photoluminescent portions, and thus contributes to the invisibility of the label.

The mask may be a one-time mask with a unique pattern for each product. It is thus possible to label each product with an individual series of informations, for example an individual or multiple combinations of numbers and/or latters, such as identification codes or certification informations related to the product, as well as one-dimension barcodes, such as UPC and EAN13 or bi-dimension barcodes, such as Datamatrix, maxicode, PDF417 and QR codes.

The method is well adapted to the labeling of transparent products, such as, without restriction, watch glasses.

The label may be deposited on any of the sides of the watch glass, for example it can be deposited onto the inner side of a watch glass, onto the outer side of the watch glass or on both sides of the watch glass.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

A first embodiment of the process for labeling a product 1 with a label 10 will now be described in relation with FIGS. 1 to 6. The product 1 may be a transparent product, such as a watch glass, a glass for a display, a transparent label, etc. It might for example be a sapphire glass.

Figure 1:
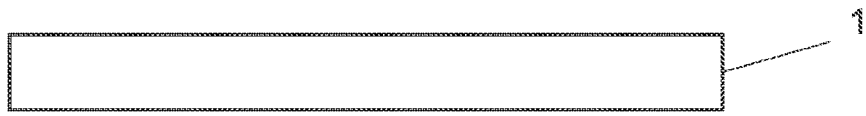
FIG. 1 shows an example of product to be marked.
Figure 2:
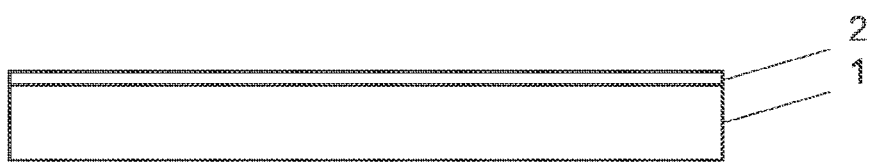
FIGS. 2, 3 and 4 show the successive deposition of layers onto said product, so as to create a stack of photoluminescent material.

On FIG. 2, a relatively thick initial layer 2 of a first material, such as AlN is deposited onto the product 1, for example on the inner side of a watch glass. This initial layer is optional; it improves the adhesion of the following layers onto the substrate. The thickness of the initial layer 2 may be between 20 and 1000 nm.

Figure 3:

On FIG. 3, a stacking with an additional layer 3 of the second material, such as GaN, and a layer 4 of a first material, such as AlN, is deposited onto the initial layer 2.

The layer 3 of second material, such as GaN, may have a thickness of less than 20 nm, for example between 2 and 8 nm.

A layer 4 of first material, such as AlN, is then deposited onto the first layer 3. The layer 4 may have a thickness of less than 50 nm, for example between 5 and 15 nm. The layer 4 of first material is thus thinner than the layer 2 of first material.

Lattice parameter mismatches between the GaN layer 3 and the AlN layer 4 create a local strain at the interface between AlN layer 4 and GaN layer 3, resulting in GaN/AlN quantum nano-structures. Such quantum nano-structures trap free current carriers (i.e. electrons and holes in a semiconductor), hence improving their radiative recombination rates. In particular, the quantum nano-structures absorb UV light and reemit visible light.

The layers 4 of first material, such as Aluminum Nitride, AlN, may comprise less than or equal 20% of Magnesium, Silicon, Lithium, Berilium, Cadmium and/or Zinc as dopant elements.

Rare-earth elements with contents of less than or equal 10% may be included into some or all layers of the second material, for increasing the amount of light emitted and/or for controlling its color.

The second material may be a GaN alloy with less than or equal 50% of Indium, Aluminum, Arsenic and/or Phosphor, for increasing the amount of light emitted and/or for controlling its color.

Various type of quantum nano-structures may be used within the invention, including quantum wires, quantum wells, and/or quantum dots. 3D nano-structures, such as quantum dots, might be less transparent due to their higher roughness degree, when compared to 2D nano-structures, such as quantum wells. On another hand, 3D nano-structures exhibit higher light emission performances when comparing to 2D nano-structures.

Therefore, an adequate combination of 3D and 2D nano-structures may present an acceptable trade-off between transparency and light emission performance.

In one embodiment, the product includes a suitable combination of 2D nano-structures, such as quantum well, and 3D nano-structures, such as quantum dots, for increasing the amount of reemitted light without prejudicing the transparency when no light is reemitted.

The quantum nano-structures may grow by various methods, such as sputtering, molecular beam epitaxy, atomic layer deposition or metal organic chemical vapour deposition. These processes enable a growth control of the monolayer precision, allowing a precise control of the quantum nano-structure size, and thus a control of the quantum nano-structure emission color, as will be discussed hereafter.

The method may comprise a step of roughing at least one layer of second material for creating said quantum dots in layers 3 of second material.

Figure 4:
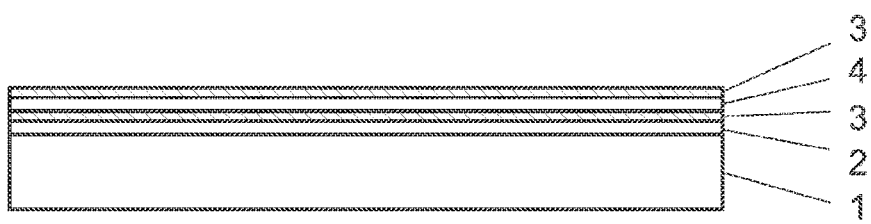

By repeating this process N times, a stack is then created as shown on FIG. 4. The number N of stackings in the stack may be for example between 4 and 100 stackings, each stacking comprising one layer of the first material 4 and one layer of the second material 3. This results in an increased luminosity of the final label 11.

This stack is transparent under invisible light, but is revealed by photoluminescence under UV illumination.

Figure 5:
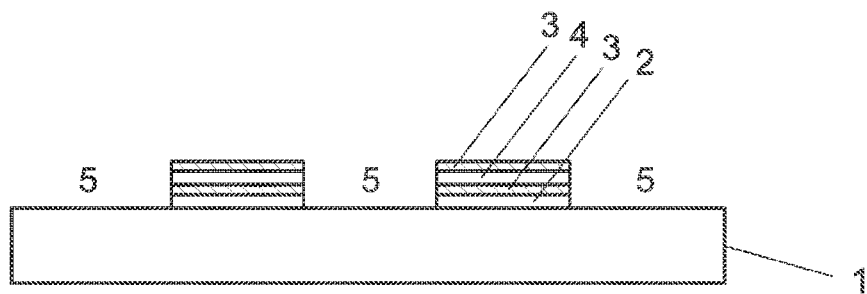
FIG. 5 shows the engraving of selected portions of the created stack, so as to delimitate photoluminescent portions of label with a process according to a first embodiment of the invention.
Figure 6:
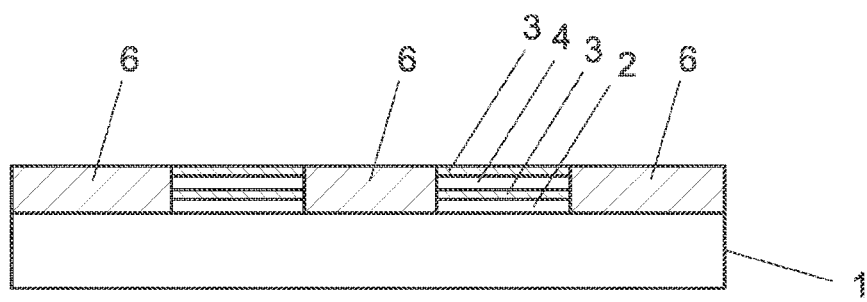
FIG. 6 shows the filling of the engraved portions with transparent material, so as to create non photoluminescent portions of label.

We will now describe with FIGS. 5-6 a first embodiment of a process for producing nearly invisible, non reemitting regions.

Figure 8:
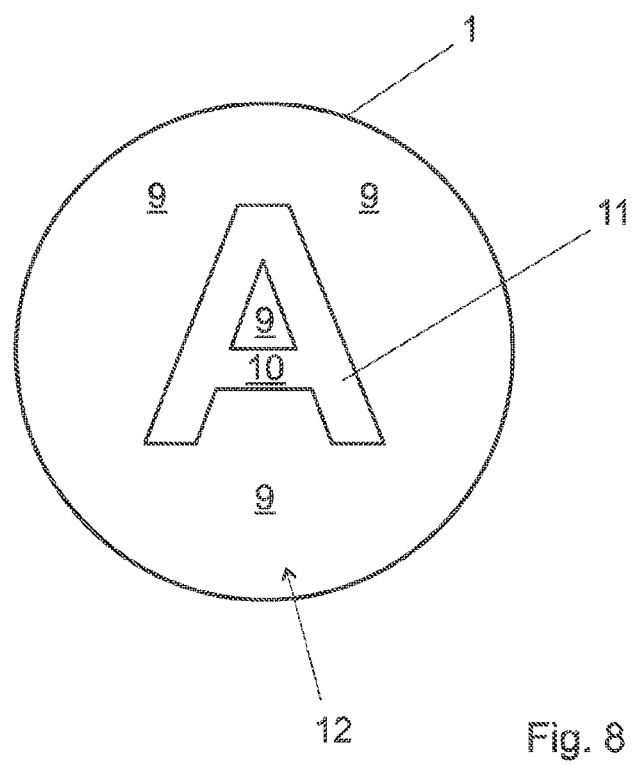
FIG. 8 shows an example of label.

In this first embodiment, the layers 2,3,4 of the stack are engraved in order to create a pattern or a logo 11 as shown in FIG. 8. In such a case, difference in the refraction index between the photoluminescent portions 10 and the ambient air creates a partial refraction of the light at the interface, so that the motive would be visible even under normal light conditions.

In order to reduce this problem, the portions 9 of the mark 12 on which the photoluminescent stack is engraved are filled with a non photoluminescent material 6, as shown on FIG. 6. This material 6 is selected to have a refractive index similar to the one of the stack; similar means here that the refractive index is close to the refractive index of the stack, and in any case much closer than the refractive index of ambient air to the stack.

The non photoluminescent material 6 may be deposited over the complete surface of the mark 12. In one embodiment, it may cover the photoluminescent portions 10 as well.

Figure 7:
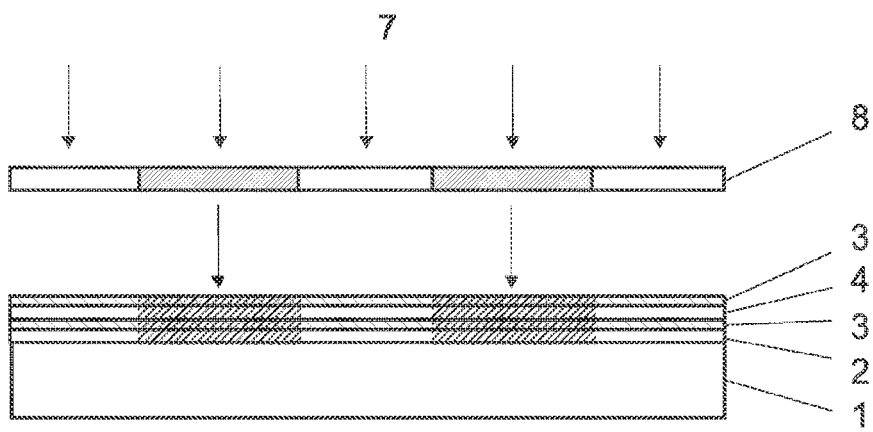
FIG. 7 shows the ion incorporation into the stack, so as to deactivate the photoluminescent ability of selected portions of the stack and to create non photoluminescent portions of the label with a process according to a second embodiment of the invention.

We will now describe with FIGS. 7-8 a second embodiment of a process for producing nearly invisible, non reemitting regions.

In this second embodiment, as illustrated on FIG. 7, a stack of first and second layers 3,4 is deposited over the whole surface of the mark 12; in this embodiment, the mask 8 could be omitted, although it could be used to define the boundaries of the mark 12, or some pattern within the mark.

Non photoluminescent portions 9 are then created in this stack by incorporating into the layers ions 7, such as Oxygen, Nitrogen, Hydrogen, Helium, Neon, Argon, Magnesion, Lithium, Beryllium, Bore, Phosphor, Aluminum, Zinc, Arsenic, Galium, Silicon, Cadmium ions, and/or any kind of element capable of degrading the photoluminescent stack. The ions create non-rediative defects into the exposed portions 9, and thus deactivate their photoluminescent ability.

By carefully selecting the portions 9 of the stack in which the ions are incorporated, it is possible to create a mark 12 with a photoluminescent pattern 11 and non photoluminescent portions 9. The ions may be incorporated through a mask 8.

Since only a limited number of ions need to be incorporated for this purpose, they don't modify much the refractive index of the exposed portions 9. The boundary between the photoluminescent portions 10 and the non photoluminescent portions 9 is thus entirely invisible.

The mask 8 may be one-time masks. They may be personalized. Therefore, the pattern 11 may be unique for each product.

The color, or wavelength, of the light emitted by the GaN/AlN quantum nano-structure depends on several factors in addition to the energy bandgaps of bulk GaN or AlN. First, the energy quantization in such a low-dimensional quantum nano-structure yields an energy transition depending on the quantum nano-structure size, as the smaller the structure the larger the fundamental state energy level. Second, the large polarization mismatch between GaN and AlN results in a huge electric field in GaN/AlN quantum nano-structures, which is about 5 MV/cm. This electric field reduces the effective transition energy in such structures. This is known as the quantum confined Stark effect (QCSE). The strong QCSE induced by the large polarization electrical field results in UV absorbtion by the quantum nano-structure, while visible light is emitted from the ground state of such structure.

By controlling carefully the quantum nano-structure size, the energy transition, and thus the emitted light, can be tuned over a broad range of colors.

As previously discussed, another parameter can be used in order to tune the emission color. Indeed, large carrier densities inside the quantum nano-structures may screen the QCSE, which yields a blue-shift emission. This happens under large pump power. Indeed, when varying the UV illumination intensity from low to high, emitted light from the quantum nano-structure shifts to shorter wavelengths, such as from yellow to green or green to blue. This feature is due to the QCSE and is thus a unique property of GaN/AlN quantum nano-structures and, which cannot be replicated using alternate technologies, for example phosphors or rare earth elements, such as, Thulium, Erbium, Europieum or Praseodynium, as the emission color of such materials is set by their intrinsic characteristics.

Therefore, in one embodiment, a mark 12 is created with quantum nano-structures whose reemitted light color depends on the intensity of UV light, resulting in photoluminescent portions of a variable color which are even more difficult to reproduce.

The invention claimed is:

1. A product comprising a photoluminescent pattern, wherein said pattern comprises:
   a photoluminescent portion which is transparent under normal light conditions and revealed by photoluminescence under UV illumination, said photoluminescent portion comprising a stack comprising successive pairs of layers, said pairs of layers each comprising a first layer of a first material with a thickness of less than or equal to 1 micron and a second layer of a second material with a thickness of less than or equal 10 nm, wherein the interface between the first layer and the second layer of the pairs of layers includes quantum nano-structures;
   a non-photoluminescent portion which is transparent under normal light conditions as well as under UV illumination, said non-photoluminescent portion comprising an additional transparent material or ions for raising the transparency.

2. The product of claim 1, wherein said ions include Oxygen, Nitrogen, Hydrogen, Helium, Neon, Argon, Magnesium, Lithium, Beryllium, Boron, Phosphor, Aluminum, Zinc, Arsenic, Gallium, Silicon, Cadmium and/or any element capable of degrading the photoluminescent stack and creating non-radiative recombination center defects into the stack.

3. The product of claim 1, wherein said transparent material as a refractive index substantially equal to the refractive index of said stack.

4. The product of claim 1, wherein said product is transparent.

5. The product of claim 1, wherein said stack comprises fewer than or equal to 100 layers.

6. The product of claim 1, wherein said second layers of second material comprise GaN alloys with less than 50% of Indium, Aluminum, Arsenic and/or Phosphor.

7. The product of claim 1, wherein said second layers of second material comprise less than or equal to 10% rare-earth elements.

8. The product of claim 1, wherein said quantum nano-structures comprise quantum dots.

9. The product of claim 1, wherein said first layers of first material comprise less than 20% of Magnesium, Silicon, Lithium, Beryllium, Cadmium and/or Zinc as dopant elements.

10. The product of claim 1, wherein said ions include Oxygen, Nitrogen, Hydrogen, Helium, Neon, Argon, Magnesium, Lithium, Beryllium, Boron, Phosphor, Aluminum, Zinc, Arsenic, Gallium, Silicon, or Cadmium.

11. The product of claim 1, wherein said ions are disposed in a pattern.

12. The product of claim 11, wherein said pattern comprises alpha-numeric text, figures, drawings, identification codes, or logos.

13. The product of claim 1, wherein said transparent material has a refractive index substantially equal to the refractive index of said stack.

14. The product of claim 1, Wherein the photoluminescent portion emits light in response to UV illumination and the color of light emitted by the photoluminescent portions depends on the intensity of the UV illumination.

15. The product of claim 1, wherein said UV illumination comprises UV wavelengths of less than or equal 400 nm.

16. The product of claim 1, wherein the transparent material covers the photoluminescent portion.

17. The product of claim 1, wherein the non-photoluminescent portion comprises the stack and wherein the stack of the non-photoluminescent portion comprises non-radiative defects that deactivate the photoluminescent ability of the stack in the non-photoluminescent portion.

18. The product of claim 1, wherein the photoluminescent portion emits light in response to UV illumination and the color of light emitted by the photoluminescent portions depends on the quantum nano-structure size.

19. The product of claim 1, wherein at least one layer of second material is roughened.

20. The product of claim 1, wherein the quantum nano-structures are quantum wires, quantum wells, or quantum dots.

* * * * *